US006844216B2

(12) United States Patent
Cobbley et al.

(10) Patent No.: US 6,844,216 B2
(45) Date of Patent: *Jan. 18, 2005

(54) METHOD OF ATTACHING SOLDER BALLS TO BGA PACKAGE UTILIZING A TOOL TO PICK AND DIP THE SOLDER BALL IN FLUX

(75) Inventors: Chad A. Cobbley, Boise, ID (US); Michael B. Ball, Boise, ID (US); Marjorie L. Waddel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/358,630

(22) Filed: Feb. 4, 2003

(65) Prior Publication Data

US 2003/0121957 A1 Jul. 3, 2003

Related U.S. Application Data

(63) Continuation of application No. 09/167,763, filed on Oct. 7, 1998, now Pat. No. 6,595,408.

(51) Int. Cl.[7] .......................... H01L 24/44; B23K 35/12; H05K 3/30
(52) U.S. Cl. ........................ 438/106; 438/612; 228/245; 29/841
(58) Field of Search ................................ 438/106, 612; 228/245, 41, 180.1; 29/841

(56) References Cited

U.S. PATENT DOCUMENTS

| 3,716,907 A | 2/1973 | Anderson |
| 3,719,981 A | 3/1973 | Steitz |
| 4,074,342 A | 2/1978 | Honn et al. |
| 4,332,341 A | 6/1982 | Minetti |
| 4,462,534 A | 7/1984 | Bitaillou et al. |
| 4,604,644 A | 8/1986 | Beckham et al. |
| 4,688,939 A | 8/1987 | Ray |
| 4,783,722 A | 11/1988 | Osaki et al. |
| 4,788,767 A | 12/1988 | Desai et al. |
| 4,830,264 A | 5/1989 | Bitaillou et al. |
| 4,871,110 A | 10/1989 | Fukasawa et al. |
| 4,897,918 A | 2/1990 | Osaka et al. |
| 4,914,814 A | 4/1990 | Behun et al. |
| 4,932,883 A | 6/1990 | Hsia et al. |
| 4,934,309 A | 6/1990 | Ledermann et al. |
| 5,058,178 A | 10/1991 | Ray |
| 5,060,844 A | 10/1991 | Behun et al. |
| 5,088,639 A | 2/1992 | Gondotra et al. |
| 5,109,601 A | 5/1992 | McBride |
| 5,118,027 A | 6/1992 | Braun et al. |
| 5,133,495 A | 7/1992 | Angulas et al. |
| 5,155,905 A | 10/1992 | Miller, Jr. |
| 5,162,257 A | 11/1992 | Yung |
| 5,203,075 A | 4/1993 | Angulas et al. |
| 5,219,117 A | 6/1993 | Lin |
| 5,255,839 A | 10/1993 | da Costa Alves et al. |

(List continued on next page.)

FOREIGN PATENT DOCUMENTS

| DE | WO9843307 | 10/1998 |
| JP | 2278831 | 11/1990 |
| JP | 6023530 | 2/1994 |
| JP | 6163550 | 5/1994 |

*Primary Examiner*—Matthew Smith
*Assistant Examiner*—Lex H. Malsawma
(74) *Attorney, Agent, or Firm*—TraskBritt

(57) ABSTRACT

A method of attaching solder balls to a BGA package using a ball pickup tool. An array of solder balls is formed on a first substrate for interconnecting with conductive sites on another substrate. The ball pickup tool picks up balls with a vacuum suction from a fluidized ball reservoir and utilizes a puff of gas to release the solder ball(s) carried thereon to conductive sites of a substrate for bonding thereto. In another embodiment, the bond pads of a substrate are coated with a flux or adhesive and lowered into a fluidized ball reservoir for direct attachment of solder balls.

19 Claims, 9 Drawing Sheets

U.S. PATENT DOCUMENTS

| | | |
|---|---|---|
| 5,279,045 A | 1/1994 | Odashima et al. |
| 5,284,287 A | 2/1994 | Wilson et al. |
| 5,330,574 A | 7/1994 | Nakagawa et al. |
| 5,410,806 A | 5/1995 | Schneider |
| 5,419,481 A | 5/1995 | Lasto et al. |
| 5,431,332 A | 7/1995 | Kirby et al. |
| 5,442,852 A | 8/1995 | Danner |
| 5,445,313 A | 8/1995 | Boyd et al. |
| 5,467,913 A | 11/1995 | Namekawa et al. |
| 5,482,736 A | 1/1996 | Glenn et al. |
| 5,491,301 A | 2/1996 | Akiba et al. |
| 5,492,266 A | 2/1996 | Hoebener et al. |
| 5,504,277 A | 4/1996 | Danner |
| 5,506,385 A | 4/1996 | Murakami et al. |
| 5,516,030 A | 5/1996 | Denton |
| 5,540,250 A | 7/1996 | Mullins |
| 5,540,377 A | 7/1996 | Ito |
| 5,574,801 A | 11/1996 | Collet-Beillon |
| 5,591,941 A | 1/1997 | Acocella et al. |
| 5,597,110 A | 1/1997 | Melton et al. |
| 5,607,099 A | 3/1997 | Yeh et al. |
| 5,611,705 A | 3/1997 | Pfaff |
| 5,615,823 A | 4/1997 | Noda et al. |
| 5,617,990 A | 4/1997 | Thompson, Sr. |
| 5,620,927 A | 4/1997 | Lee |
| 5,626,277 A | 5/1997 | Kawada |
| 5,633,204 A | 5/1997 | Tago et al. |
| 5,637,832 A | 6/1997 | Danner |
| 5,643,831 A | 7/1997 | Ochiai et al. |
| 5,657,528 A | 8/1997 | Sakemi et al. |
| 5,658,827 A | 8/1997 | Aulicino et al. |
| 5,668,059 A | 9/1997 | Christie et al. |
| 5,669,970 A | 9/1997 | Balog et al. |
| 5,672,542 A | 9/1997 | Schwiebert et al. |
| 5,675,889 A | 10/1997 | Acocella et al. |
| 5,680,984 A | 10/1997 | Sakemi |
| 5,685,477 A | 11/1997 | Mallik et al. |
| 5,687,901 A | 11/1997 | Hoshiba et al. |
| 5,695,667 A | 12/1997 | Eguchi et al. |
| 5,704,535 A | 1/1998 | Thompson, Sr. |
| 5,704,536 A | 1/1998 | Chen et al. |
| 5,750,199 A | 5/1998 | Sakemi |
| 5,758,409 A | 6/1998 | Nakazato |
| 5,788,143 A | 8/1998 | Boyd et al. |
| 5,867,260 A | 2/1999 | Sakai |
| 6,065,201 A | 5/2000 | Sakai |
| 6,069,483 A | 5/2000 | Maxwell et al. |
| 6,109,509 A | 8/2000 | Sakai et al. |
| 6,196,439 B1 | 3/2001 | Mays et al. |
| 6,254,923 B1 | 7/2001 | Boyd et al. |
| 6,268,648 B1 | 7/2001 | Fukutomi et al. |
| 6,595,408 B1 * | 7/2003 | Cobbley et al. ............ 228/245 |

* cited by examiner

METHOD OF ATTACHING SOLDER BALLS TO BGA PACKAGE UTILIZING A TOOL TO PICK AND DIP THE SOLDER BALL IN FLUX

CROSS-REFERENCE TO RELATED APPLICATION

This application is a continuation of application Ser. No. 09/167,763, filed Oct. 7, 1998, now U.S. Pat. No. 6,595,408, issued Jul. 22, 2003.

BACKGROUND OF THE INVENTION

1. Field of the Invention

This invention relates generally to semiconductor device manufacturing. More particularly, the instant invention pertains to methods and apparatus for handling solder balls in forming ball-grid-arrays (BGAs).

2. State of the Art

Integrated circuit semiconductor devices (ICs) are small electronic circuits formed on the surface of a wafer of semiconductor material such as silicon. The ICs are fabricated in plurality in wafer form and tested by a probe to determine electronic characteristics applicable to the intended use of the ICs. The wafer is then subdivided into discrete IC chips or dice, and then further tested and assembled for customer use through various well-known individual die IC testing and packaging techniques, including lead frame packaging, Chip-On-Board (COB) packaging, and flip-chip packaging (FCP). Depending upon the die and wafer sizes, each wafer is divided into a few dice or as many as several hundred or more than one thousand discrete dice.

Interconnection of discrete semiconductor packages onto a substrate such as a printed circuit board (PCB) is often accomplished with solder preforms having spherical, near-spherical or other shapes. In a process using a ball-grid-array (BGA), spherical or near-spherical solder balls are attached to prefluxed metalized locations on a workpiece such as a circuit board or a semiconductor device. The workpiece is then heated, typically at temperatures of 183° C. or greater, to reflow the solder balls, and the solder balls become attached to the metalized locations during subsequent cooling. A semiconductor package or circuit board having a corresponding but reversed pattern of connection sites may then be aligned with the BGA and bonded to it by controlled heating in a reflow furnace.

The use of flip-chip technology with solder bumps has numerous advantages for interconnection. Flip-chip technology provides improved electrical performance for high frequency applications such as mainframes and computer workstations. Flip-chip interconnections are of very small size. In addition, easier thermal management and reduced susceptibility to interference caused by a variety of sources are inherent.

Surface mount technology (SMT) using solder "bump" interconnects eliminates the outer package leads level of interconnection, significantly reducing the cost.

Solder bumps may be formed on a workpiece by processes of evaporation, electroplating, stencil printing and serial methods. Each of these processes has particular limitations. Illustrated in U.S. Pat. No. 5,672,542 of Schwiebert et al. is an example of a modified stencil printing process.

In U.S. Pat. No. 3,716,907 of Anderson, the use of germanium hemispheres as conductive contacts is disclosed.

Relative to other types of interconnections, the use of solder preforms, in particular spherical or near-spherical balls, has proven to have significant advantages. One advantage is that while the solder balls are formed with significant ball-to-ball size differences, they may be easily classified by size prior to application to a workpiece. Thus, a uniform size of solder balls may be used within a ball-grid-array.

Various methods have been used for aligning, placing, retaining and fixing solder balls on an array of sites on a workpiece.

In U.S. Pat. No. 5,620,927 of Lee, a template with an array of through-holes is placed on the workpiece and solder balls are introduced into the holes by rolling the solder balls across the workpiece surface. The apparatus may be installed on a tilt table to encourage filling of all holes. In U.S. Pat. No. 4,871,110 of Fukasawa et al., a template having an array of holes is placed on a ball holder with a like array of smaller holes to which vacuum is applied and over which solder balls are rolled. After the array is filled with solder balls, the template and ball holder with balls are removed and the exposed ends of the balls are attached to a substrate by e.g. reflow. The template and ball holder are then pulled from the substrate, leaving a ball-grid-array ready for attachment to another substrate or workpiece.

As shown in U.S. Pat. No. 3,719,981, an array of solder balls is arranged on the tacky surface of a pressure sensitive (PS) tape for alignment through a template to solder bumps on a wafer. After thermal reflow, the template and tape are removed.

The use of a template for forming solder bumps or "balls" on a workpiece from flux and solder pieces is disclosed in U.S. Pat. No. 5,492,266 of Hoebener et al.

In U.S. Pat. No. 5,431,332 of Kirby et al., a template is placed over the bond pads of a substrate, solder balls are poured over the template, and an air knife "sweeps" the surface free of excess solder balls.

The use of a ball pickup tool with an array of vacuum suction ball retainers to pull up balls from an underlying reservoir is disclosed in U.S. Pat. No. 5,088,639 of Gondotra et al., U.S. Pat. No. 5,284,287 of Wilson et al., U.S. Pat. No. 5,445,313 of Boyd et al., U.S. Pat. No. 5,467,913 of Nemekawa et al., U.S. Pat. No. 5,615,823 of Noda et al., U.S. Pat. No. 5,680,984 of Sakemi, U.S. Pat. No. 5,685,477 of Mallik et al., U.S. Pat. No. 5,687,901 of Hoshiba et al., and U.S. Pat. No. 5,695,667 of Eguchi et al. In each of these publications, release of the array of solder balls onto contacts of a substrate is accomplished by shutting off the vacuum.

U.S. Pat. No. 5,506,385 of Murakami et al. discloses the use of a single manipulatable suction head for picking up a solder ball, moving it to a position above a fluxed contact pad on a substrate, and depositing it on the contact pad.

U.S. Pat. No. 5,695,667 shows a single ball suction head which is used to place a solder ball on a contact pad which is missing a solder ball of a ball-grid-array.

The application of flux to solder balls held in a vacuum apparatus by dipping the balls into a flux reservoir is taught in U.S. Pat. No. 5,088,639 of Gondotra et al. and in U.S. Pat. No. 5,284,287 of Wilson et al.

The use of ultrasonic vibration to cause solder ball movement in the ball reservoir, and to remove excess solder balls from a vacuum pickup tool, is taught in U.S. Pat. No. 5,687,901 of Hoshiba et al.

BRIEF SUMMARY OF THE INVENTION

At present, the invention is directed to methods and apparatus for handling solder balls in forming ball-grid-arrays (BGAs) for manufacturing reliable interconnections between a semiconductor device and a substrate.

BRIEF DESCRIPTION OF THE SEVERAL VIEWS OF THE DRAWINGS

The following drawings illustrate various embodiments of the invention, wherein.

DETAILED DESCRIPTION OF THE INVENTION

The invention comprises an improved method and apparatus for forming a ball-grid-array of spherical or semi-spherical preformed solder balls on conductive sites on a surface of an electronic apparatus. The term "substrate" is used in a broad generic sense herein to include any semi-conductor device including a bare die, as well as traditional substrates including circuitized boards such as printed circuit boards (PCBs). The method of the invention may be applied to the attachment of solder balls to any conductive site.

Figure 1:
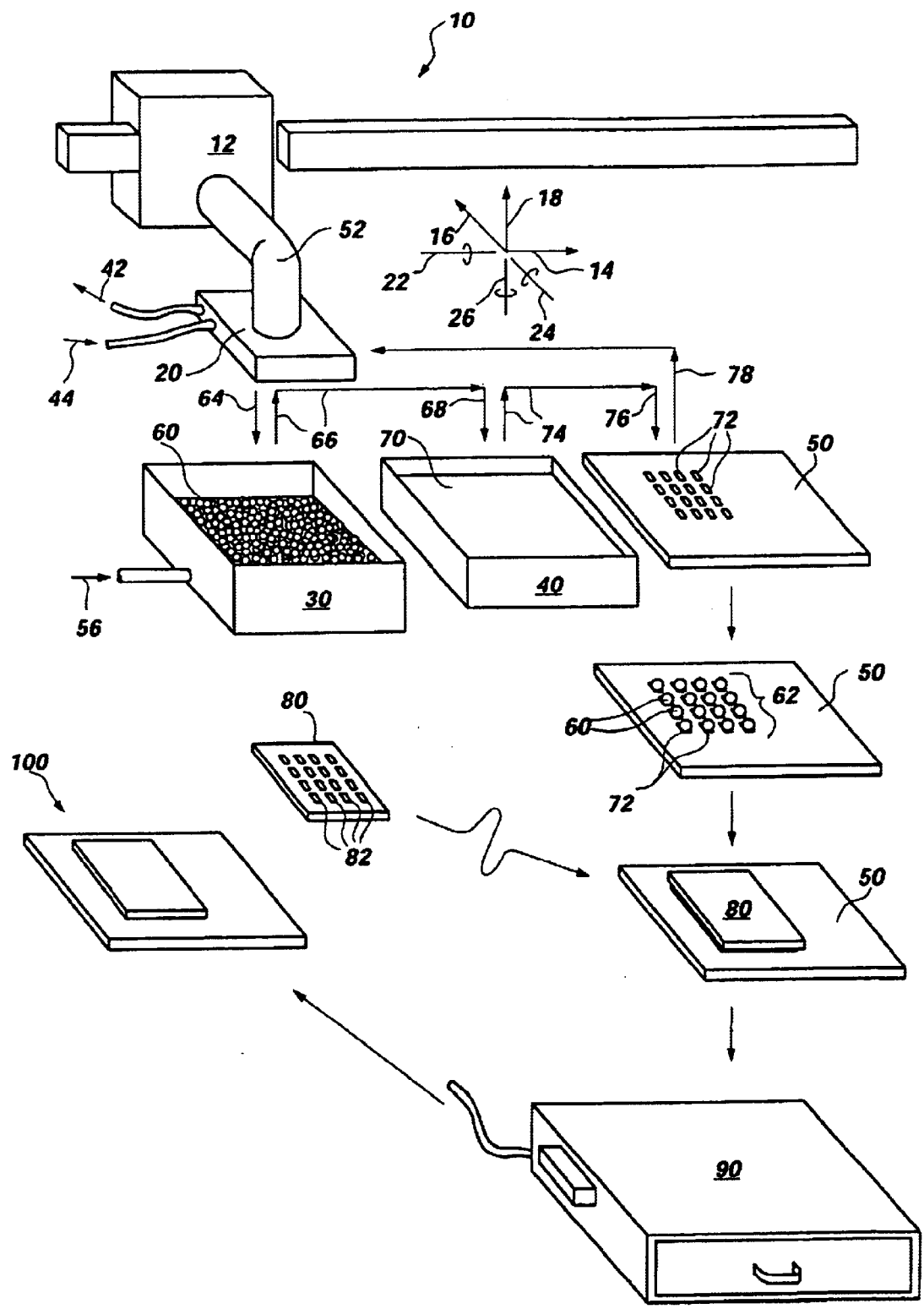
FIG. 1 is a perspective schematic view of an exemplary apparatus illustrating the steps of forming a ball-grid-array interconnection in accordance with a method of the invention.

As depicted in drawing FIG. 1, a solder ball mounting apparatus 10 includes a ball pickup tool 20, also called herein a ball pickup head. The ball pickup head 20 is connected via connector 52 to a positioner 12 which controls the movement of the ball pickup head in three axes. The ball pickup head 20 is controllable along X-axis 14, Y-axis 16 and Z-axis 18 for alignment with a ball reservoir 30, an attachment agent reservoir 40, and a first substrate 50. The ball pickup head 20 may also be controllable about one or more axes of rotation 22, 24, 26.

Figure 2:
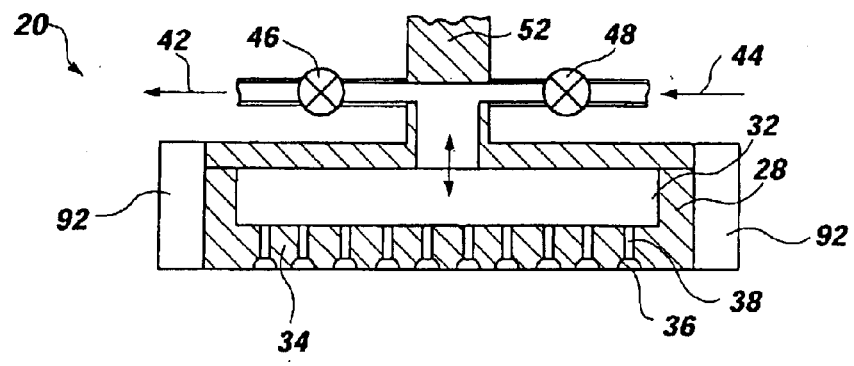
FIG. 2 is a sectional side view of a ball pickup tool useful in a method of forming a ball-grid-array interconnection in accordance with the invention.

The ball pickup head 20 may be as illustrated in drawing FIG. 2, comprising a body 28 with internal chamber 32. A lower plate 34 is shown with a plurality of generally hemispherical ball seats 36, each seat configured to attract and retain a single preformed solder ball 60. A passageway 38 between each seat 36 and the internal chamber 32 permits vacuum suction 42 or gas pressure to be controllably applied to the seats 36 for alternatively retaining solder balls 60 thereon or discharging solder balls therefrom. The internal pressure within the internal chamber 32 is controlled by alternate activation of vacuum valve 46 and compressed gas valve 48. The pickup head 20 may be provided with a heater 92 by which it can quickly attain a temperature at which a particular solder will reflow, typically 183° C. or greater, or heated to a sufficient level to at least provide a temporary bond between a solder ball 60 and a bond pad 72, forming a ball-grid-array 62.

The pattern of ball seats 36, when inverted, is configured to match a bond pad array 72 on a substrate 50 to which the balls 60 are to be attached.

Figure 3:
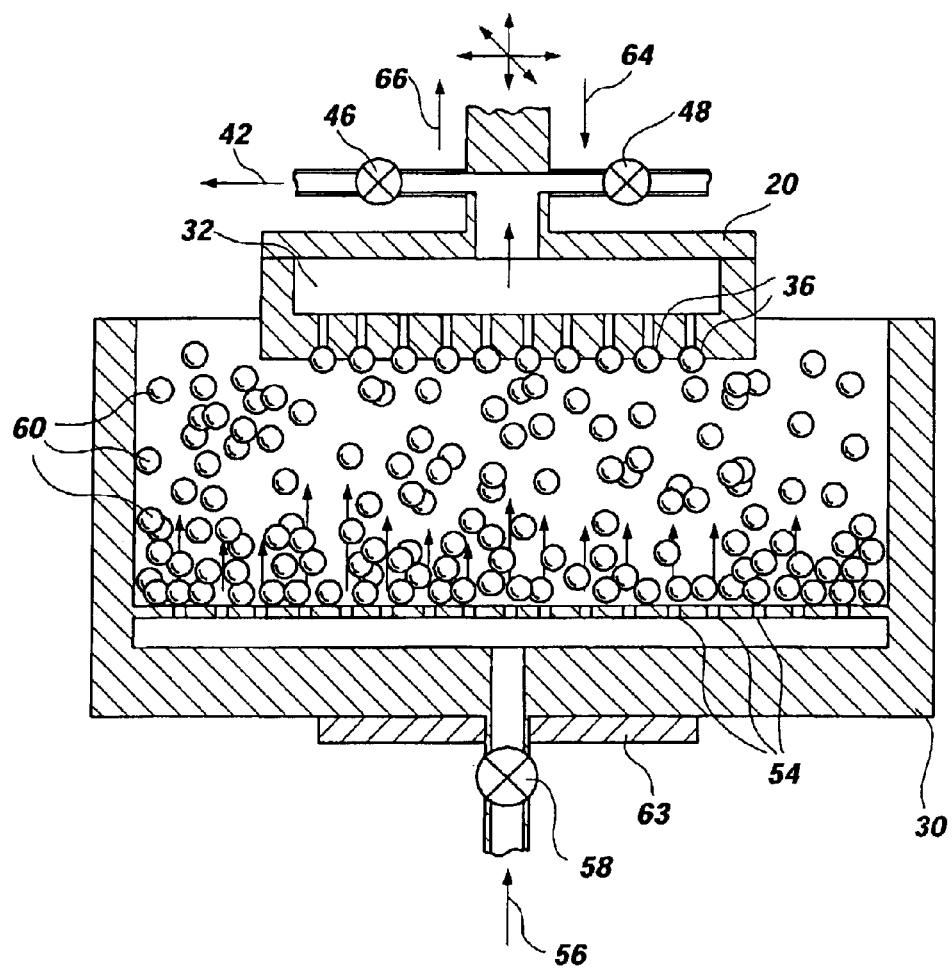
FIG. 3 is a sectional side view of a ball pickup tool picking up solder balls for the formation of a ball-grid-array interconnection in accordance with a method of the invention.

As shown in FIG. 3, a solder ball reservoir 30 is configured to hold a large number of preformed solder balls 60 and has gas sparge holes 54 for fluidizing the balls within the reservoir, whereby the balls are attracted to and held by vacuum suction in the ball seats 36. Other alternative (or additional) means for fluidizing the balls 60 may be used, such as a vibrator 63.

Figure 4:
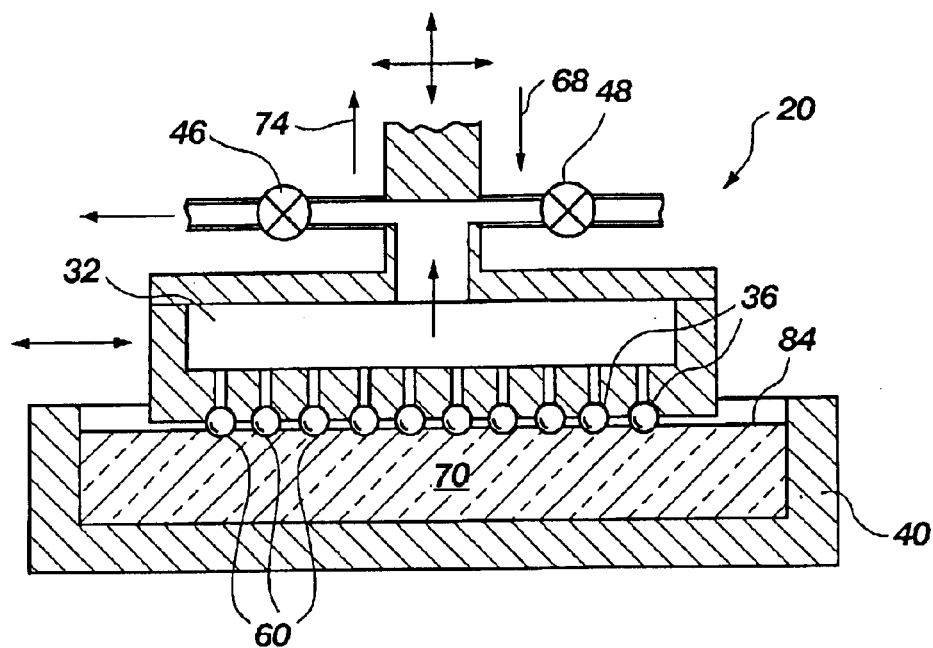
FIG. 4 is a sectional side view of a ball pickup tool in the process of dipping into a reservoir of attachment agent to apply attachment agent to the picked up balls, in accordance with a method of the invention.

As depicted in drawing FIGS. 1 and 4, the solder ball mounting apparatus 10 includes an attachment agent reservoir 40 containing an attachment agent 70. The attachment agent 70 may be a flux of conventional or other composition and, in an embodiment of the invention, comprises a pressure sensitive adhesive (PSA) which melts when heated.

The invention encompasses the use of the formed ball-grid-array 62 on a first substrate 50 for attachment of a second substrate 80 thereto. While the first substrate 50 is depicted as a circuit board, the second substrate 80 is shown as a semiconductor device. The first substrate 50 and/or second substrate 80 are moved and positioned by a positioner, not shown. The first substrate 50 has the solder balls 60 of the ball-grid-array 62 attached to the bond pads 72 on the substrate 50 by the reflow heating of the substrate 50 in a furnace. The first and second substrates 50, 80 are then adjoined and heated to a reflow temperature wherein the solder balls 60 flow to adhere to the bond pads 72 on the first substrate and bond pads 82 on the second substrate. The heating may take place in a reflow furnace 90, for example, and substrate cooling results in a high quality electrical interconnection between the two substrates.

Using this apparatus 10, several different methods may be used for attaching performed solder balls 60 to a substrate 50. In a first method, illustrated in drawing FIGS. 3–9, a ball pickup head 20 is lowered by movement 64 into the bed of fluidized solder balls 60 in reservoir 30. (See drawing FIG. 3.) The vacuum valve 46 is then opened to provide suction to the ball seats 36, which quickly become filled with solder balls 60. The pickup head 20 is then retracted from the ball reservoir 30 and positioned over an attachment agent reservoir 40 by movement 66. As shown in drawing FIG. 4, the pickup head 20 with a solder ball 60 held in each ball seat 36 is then lowered by movement 68 into the attachment agent reservoir 40 so that each solder ball 60 is slightly submerged in the surface 84 of attachment agent 70. A sub-atmospheric pressure is maintained on each solder ball 60 to hold it in its seat 36.

The attachment agent 70 is any material which permits or enhances attachment of a solder ball 60 to a bond pad 72, and temporarily holds a solder ball on the bond pad until it may be bonded by reflow thereto. Fluxes of various types are commonly used as attachment agents 70. As particularly taught in this application, a pressure sensitive adhesive (PSA) may also be used as the attachment agent 70. Pressure sensitive adhesives such as those formed of epoxy, or other suitable known adhesives, may be used.

The ball pickup head 20 is retracted from the attachment agent reservoir 40 and positioned over a bond pad array 72 of a first substrate 50 by movement 74. As depicted in drawing FIG. 5, each solder ball 60 held in a ball seat 36 of the pickup head 20 is shown with a small quantity of attachment agent 70 on its lower surface.

Figure 5:
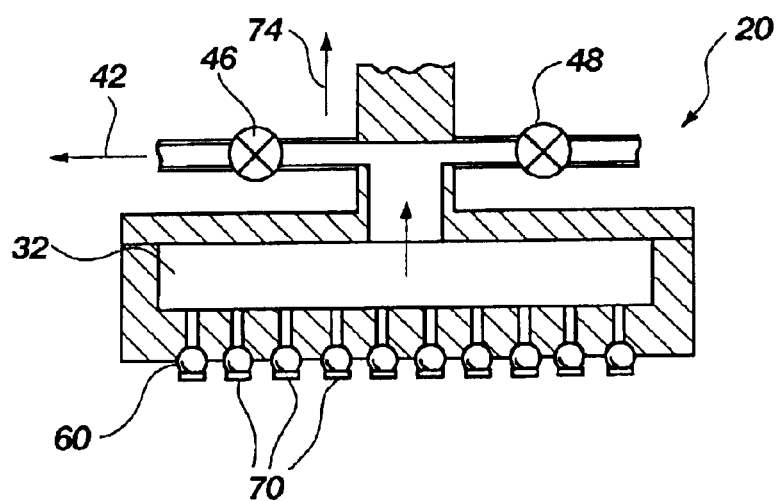
FIG. 5 is a sectional side view of a ball pickup tool following dipping into a reservoir of attachment agent, in accordance with a method of the invention.

In an alternative embodiment of the method, the attachment agent 70 is directly applied to the bond pads 72 rather than applied to the balls 60 by dipping or wiping. The step of applying attachment agent 70 to the solder balls 60 as shown in drawing FIGS. 4 and 5 is then deleted.

Figure 6:
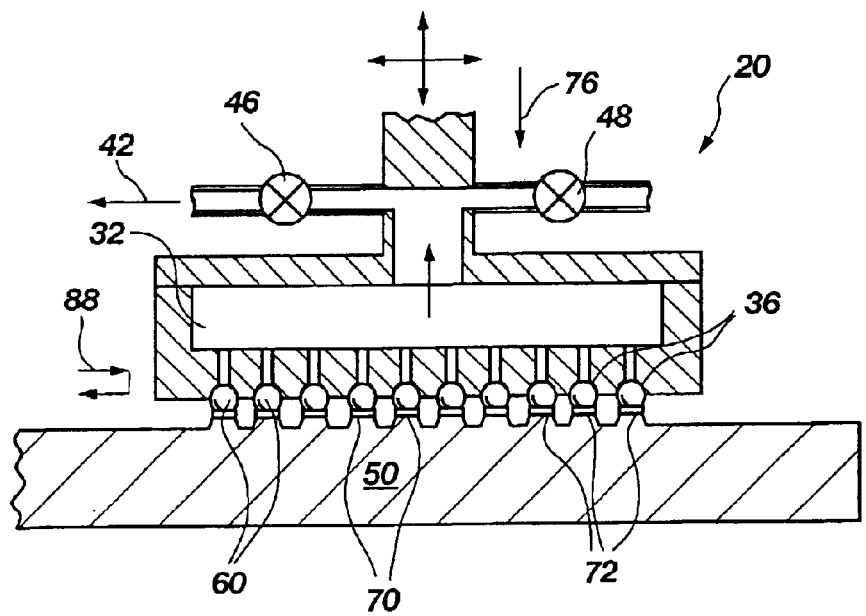
FIG. 6 is a sectional side view of a ball pickup tool aligned with a substrate in accordance with a method of the invention.
Figure 7:
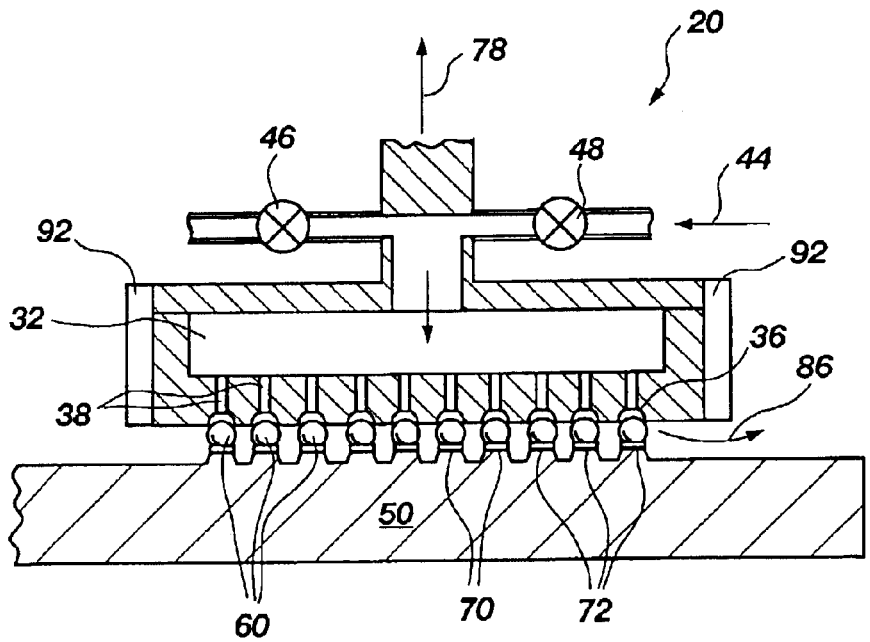
FIG. 7 is a sectional side view of a ball pickup tool placing solder balls onto the bond pads of a substrate in accordance with a method of the invention.
Figure 8:
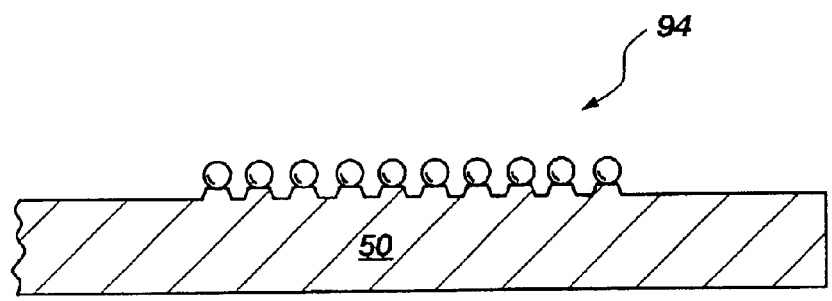
FIG. 8 is a sectional side view of a substrate having a ball-grid-array formed thereon in accordance with a method of the invention.

As depicted in drawing FIGS. 6 and 7, the ball pickup head 20 with held solder balls 60 is lowered by movement 76 until the balls 60 are just above the bond pads 72, or the attachment agent 70 just touches the bond pads. Preferably, at this time, the pickup head 20 is moved slightly in a lateral direction 88 whereby each ball wipes the attachment agent 70 over the bond pad surface to enhance subsequent bonding. The optimum vertical position is dependent on several factors including ball size, bond pad size, type and quantity of attachment agent 70, etc. and may be found by a process of trial and error.

As shown in drawing FIG. 7, the vacuum valve 46 is shut off and the compressed gas valve 48 is opened for a brief time, and the "puff" of pressure ejects the balls 60 onto the bond pads 72. The small quantity of attachment agent 70 holds each ball 60 in a generally central portion of its bond pad 72. Each ball 60 moves a very small distance, but the movement is sufficient to permit gas flow 86 from chamber 32 to escape past the ball. Alternatively, the pickup head may be vibrated a very small amplitude to achieve the same result.

At this point, the method of the invention may take one of several alternative steps.

First, the heater 92 may be used to provide a full reflow temperature to fully bond the solder balls 60 to the bond pads 72.

Second, the ball pickup head 20 may be lifted by movement 78 away from the first substrate 50, and the balls 60 bonded to the bond pads 72 by another source of heat. As depicted in drawing FIG. 8, the result is a first substrate 50 having a uniform ball-grid-array 94, ready for bonding to a second substrate 80.

Third, the ball pickup head 20 may be lifted by movement 78 from the first substrate 50 and the balls 60 bonded to the bond pads 72 by another source of heat. Subsequently, a second substrate 80 is attached to the first substrate, followed by treating at a reflow temperature, e.g., by insertion in a reflow furnace 90 or heating the substrate(s) using a block heater(s) (not shown). The result is an electronic apparatus comprising two substrates 50, 80 with a reliable BGA interconnection therebetween.

Figure 9:
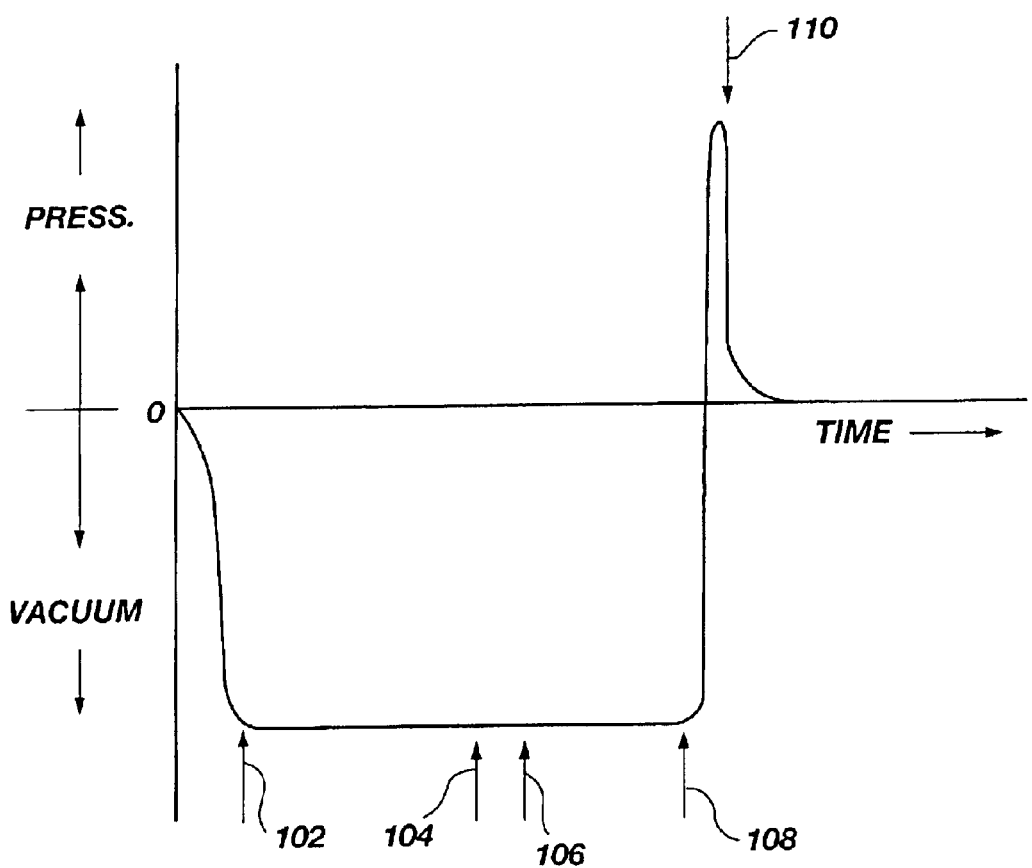
FIG. 9 is a generalized graphical representation of the pressure exerted on the ball seats of a ball pickup tool as a time function in a method of the invention.

Illustrated in drawing FIG. 9 is the time-pressure pattern of the ball pickup head 20 in the BGA formation process. Arrow 102 indicates the point at which all ball seats 36 are filled from the ball reservoir 30. Arrow 104 indicates the onset of dipping the balls 60 into the attachment agent 70, and arrow 106 indicates withdrawal of the balls from the attachment agent reservoir 40. Arrow 108 indicates the point at which the vacuum 42 is shut off, and gas (e.g., air) pressure started, to eject the balls 60 from the ball seats 36. Arrow 110 indicates the end of the gas puff when the gas 44 is shut off. The gas puff is short in duration, generally shorter than 3 seconds, and it may be less than 0.5 seconds.

Figure 10:
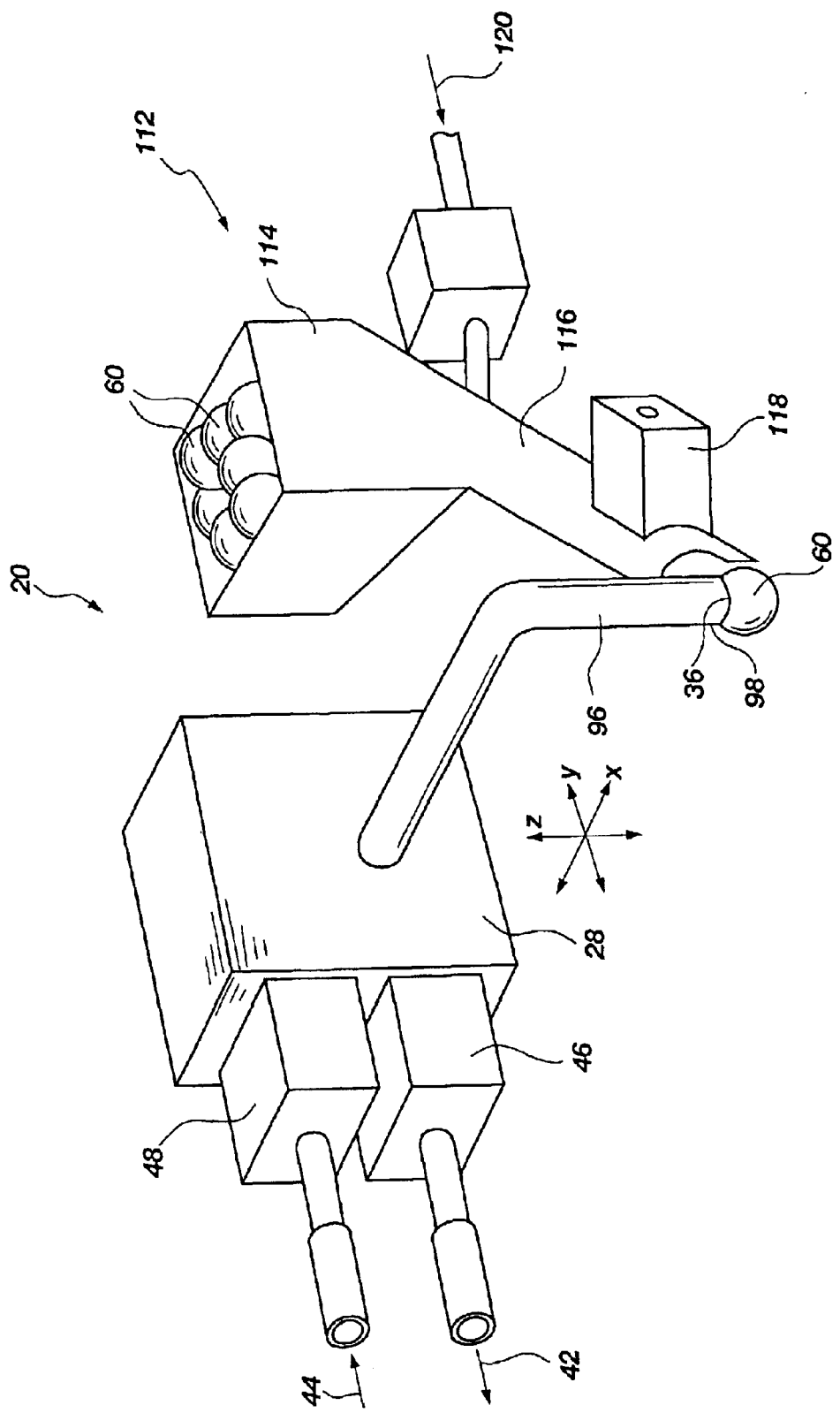
FIG. 10 is a perspective view of another embodiment of a ball pickup tool of the invention.

As shown in drawing FIG. 10, the ball pickup head or tool 20 may be configured to manipulate a single solder ball 60. While many variations in the construction are possible, the pickup head 20 is generally depicted as having a body 28 from which a hollow vacuum/pressure tip 96 extends outwardly and downwardly for holding and moving a solder ball 60 in a ball seat 36 at its distal end 98. The vacuum/pressure tip 96 is connected through a valve 46 to a vacuum source 42 for attracting and holding a solder ball 60. Valves 46 and 48 may be solenoid actuated valves. The tip 96 is also connected through a valve 48 to a compressed gas (such as air) source 44. The airflow may be controlled to provide a brief puff of pressure to the seated ball 60 to eject it from the ball seat 36 onto the surface of a bond pad, as previously described. The vacuum/pressure tip 96 may be lowered into a ball reservoir 30 and/or an attachment agent reservoir 40, as previously shown in drawing FIGS. 1–4.

In one embodiment of the single ball pickup head 20, a ball feeder 112 comprises a solder ball vessel 114 and a tubular ramp 116 leading from the vessel 114 to a position adjacent the ball seat 36 when the vacuum/pressure tip 96 is retracted upwardly. A valve 118 releases one ball 60 at a time, and may comprise a pin valve operated by a solenoid. Other types of valves 118 known in the art may be used.

A gas flow from a gas source 120 may be introduced into the ball vessel 114 near the ramp 116 to ensure uninterrupted ball flow in the ramp 116.

The ball feeder 112 is preferably maintained at a constant elevation, so that the ball pickup head 20 is retracted upwardly from a lower level to pick up a new ball 60.

The ball pickup head 20, whether of a single ball configuration or a multiple ball configuration, is connected to a positioner (not shown) by which it may be manipulated along three axes X, Y, and Z. Preferably, it may also be rotated about at least one axis. It may be incorporated in a high-speed automated machine using pattern recognition and other alignment methods, with robotic movement, and include all steps through solder reflow in an integral furnace.

Figure 11:
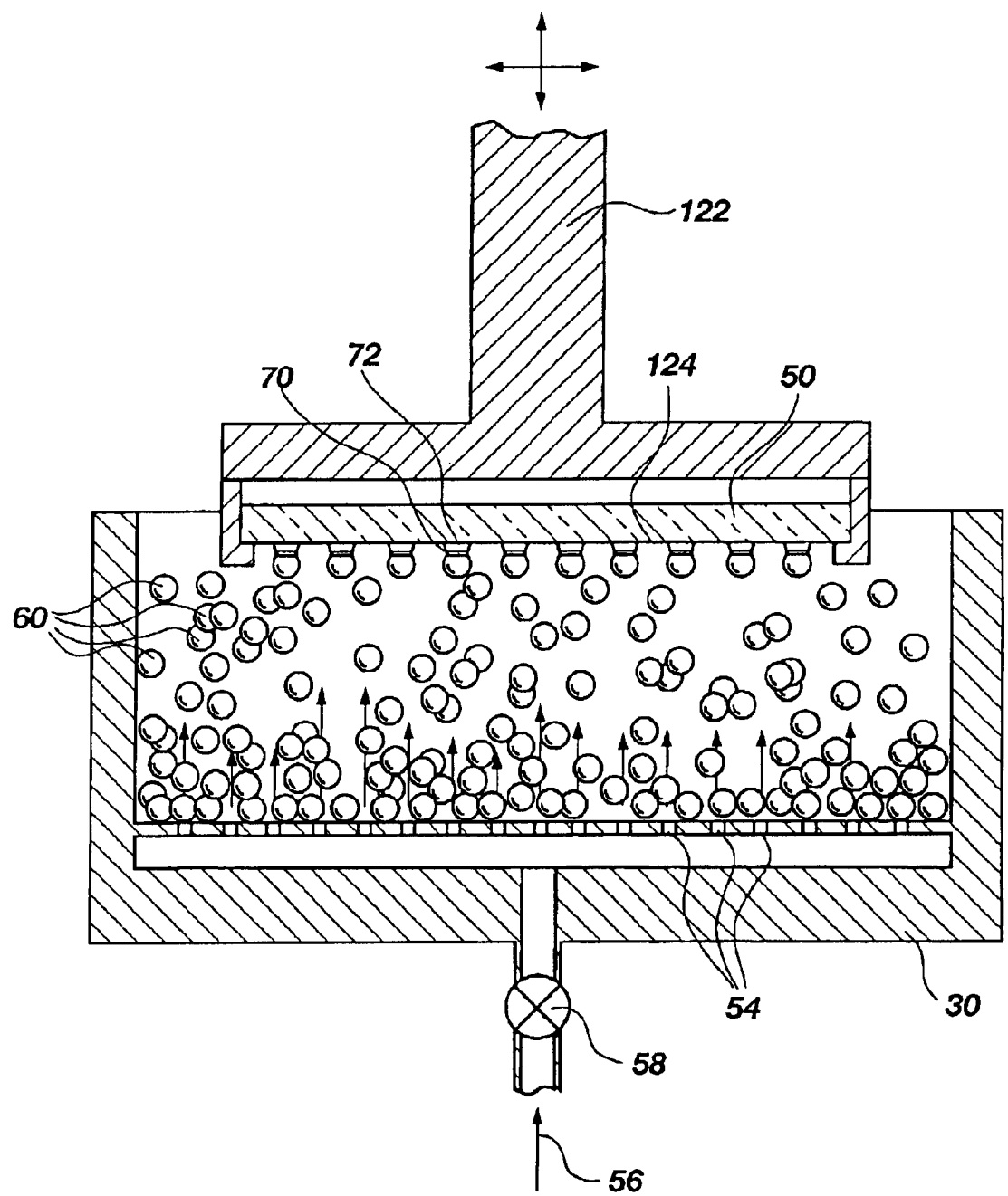
FIG. 11 is a sectional side view of a substrate in a process of having a ball-grid-array formed thereon in a method of another embodiment of the invention.
Figure 11A:
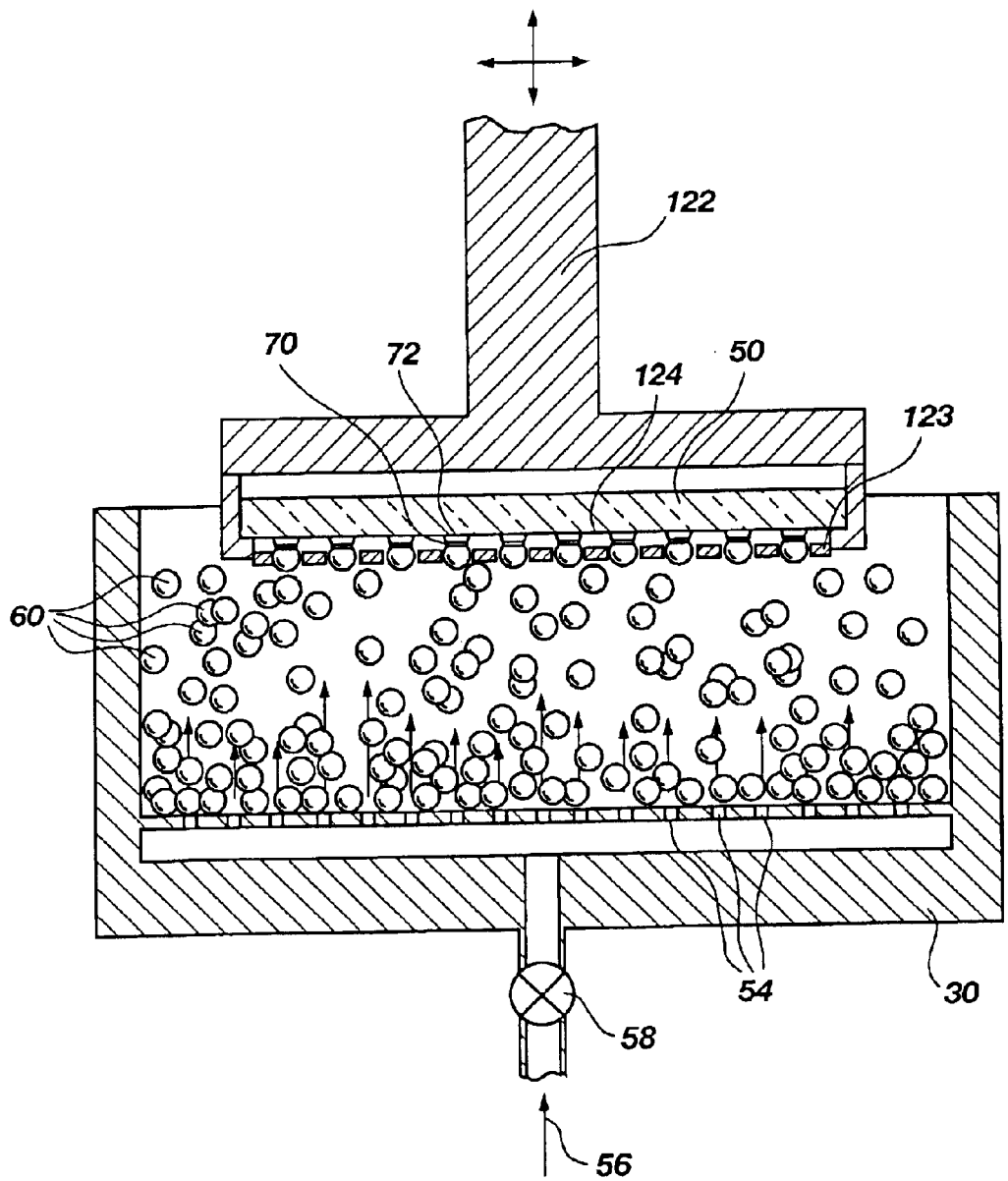
FIG. 11A is a sectional side view of a substrate in a process of having a ball-grid-array formed thereon in a method of another embodiment of the invention wherein the substrate holder includes a screen thereon.
Figure 12:
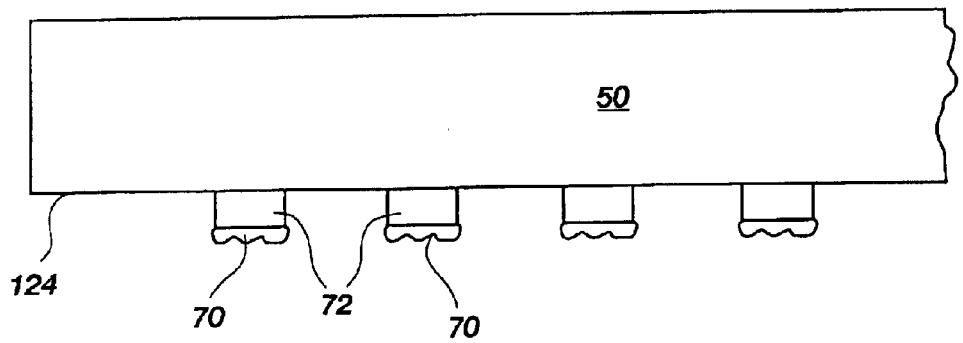
FIG. 12 is an enlarged view of a step in a process of forming a ball-grid-array on a substrate in accordance with another embodiment of the invention.
Figure 13:
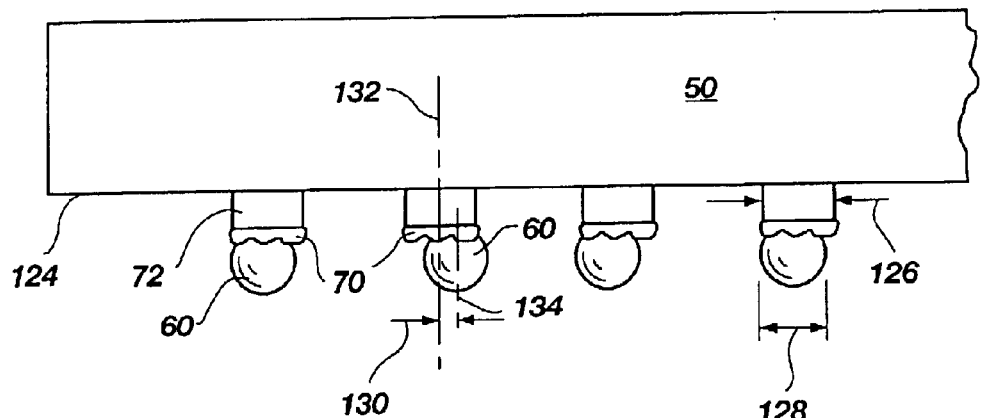
FIG. 13 is an enlarged view of a step in a process of forming a ball-grid-array on a substrate in accordance with another embodiment of the invention.
Figure 14:
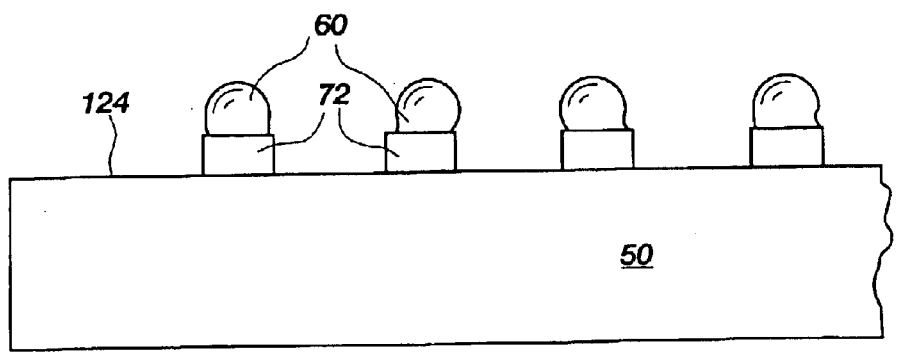
FIG. 14 is an enlarged view of a substrate having a ball-grid-array formed thereon in accordance with an embodiment of the invention.

Turning now to drawing FIGS. 11–14, an embodiment for forming a ball-grid-array interconnection of preformed solder balls 60 on a substrate 50 is illustrated. In drawing FIG. 11, a substrate 50 is retained in a substrate holder 122. In drawing FIG. 11A, the substrate holder 122 includes a screen 123 thereon, the screen 123 having a plurality of apertures therein corresponding to the array of bond pads 72 on the substrate 50 to assist in the location of the solder balls 60 on the bond pads 72 of a substrate 50. In any event, the substrate 50 has conductive bond sites, e.g., pads 72, on a lower surface 124, and each pad is coated or otherwise covered (at least partially) by an attachment agent 70, as shown in drawing FIG. 12. The agent 70 may comprise flux or a pressure sensitive adhesive (PSA). The method of application of attachment agent 70 to the bond pads 72 is important to the invention only to the extent that fluidized or non-fluidized solder balls 60 from a ball reservoir 30 will adhere to the agent. Thus, the attachment agent 70 may be applied by screening, dipping, direct flow or contact, etc.

As depicted, the method comprises lowering the array of bond pads 72 into a solder ball reservoir 30 in which balls 60 are fluidized by gas 56 introduced through valve 58 and passing through sparge holes 54. Alternatively or in addition to the gas sparging, a vibrator 63 may be used as shown in drawing FIG. 3. A solder ball 60 becomes directly attached to each bond pad 72 (See drawing FIG. 13). The substrate 50 may then be inverted as shown in drawing FIG. 14 and heated to bond the balls 60 to the bond pads 72. The substrate 50 is then ready for bonding to another substrate.

This method is very simple when compared to prior art methods of forming ball-grid-arrays. No alignment of the substrate is required for ball attachment. Alternately, if desired, a screen may be used on the substrate holder 122 to locate the solder balls on the bond pads on the substrate. No solder balls are wasted. The result is a BGA interconnection formed at very low cost.

Some variation in alignment of balls 60 on the bond pads 72 may occur, but will not affect the performance. As shown in drawing FIG. 13, the offset 130 between the bond pad centerline 132 and the ball centerline 134 is generally so small as to not be a problem. In a preferred embodiment, the bond pad side dimension 126 is minimized relative to the ball diameter 128. Preferably, the side dimension 126 does not exceed the ball diameter 128. More preferably, the side dimension 126 is not more than one-half of the ball diameter 128, i.e., does not exceed the overall ball radius. Thus, the attachment of more than one ball 60 to a bond pad 72 is generally precluded.

In addition, the bond pads 82 of a second substrate 80 to be attached to the first substrate 50 are made larger than bond pads 72. Thus, no problem is encountered in achieving a reliable BGA interconnection between the two substrates 50, 80.

The methods described herein present many advantages to the BGA formation process including higher reliability, lower cost, reduced ball wastage, etc.

This invention may be embodied in several forms without departing from the spirit of essential characteristics of the invention. The embodiments as described herein are therefore intended to be only illustrative and not restrictive, and the scope of the invention is defined by the appended claims rather than the preceding description, and all variations that fall within the metes and bounds of the subject matter claimed, or are equivalent thereto, are therefore intended to be embraced by the following claims.

What is claimed is:

1. A method for forming a ball-grid-array on a first substrate having at least one bond pad using a tool comprising:

providing a ball pickup tool having at least one orifice for picking up a preformed solder ball, said at least one orifice in said ball pickup tool including a ball seat controllably connected to a vacuum source and a pressure source;

providing a solder ball reservoir containing a plurality of preformed miniature solder balls;

lowering said ball pickup tool into said solder ball reservoir;

providing a reservoir containing an attachment agent;

applying vacuum suction from said vacuum source to said at least one orifice to attract and hold at least one solder ball of said plurality of preformed miniature solder balls within said at least one orifice; removing said ball pickup tool and said at least one solder ball from said solder ball reservoir while retaining said vacuum suction;

shutting off said vacuum suction; and applying a puff of gas pressure from said pressure source to said at least one orifice to remove said at least one solder ball from said at least one orifice.

2. The method of claim 1, further comprising: aligning said at least one solder ball with said at least one bond pad of said first substrate; and releasing said at least one solder ball onto said at least one bond pad of said first substrate.

3. The method of claim 2, further comprising:

moving said plurality of preformed miniature solder balls upwardly within said solder ball reservoir;

lowering said ball pickup tool into said solder ball reservoir and applying said vacuum suction to said at least one orifice to attract and hold said at least one solder ball within said at least one orifice;

lowering said ball pickup tool and said at least one solder ball into said attachment agent reservoir whereby said attachment agent is applied to an exposed portion of said at least one solder ball; and retracting said ball pickup tool and said at least one solder ball from said attachment agent reservoir.

4. The method of claim 3, wherein said moving said plurality of preformed miniature solder balls upwardly in said solder ball reservoir comprises injection of a gas stream into said solder ball reservoir to lift said solder balls.

5. The method of claim 2, further comprising:

heating said first substrate to a reflow temperature; and cooling a portion of said first substrate to fix said at least one solder ball to said at least one bond pad.

6. The method of claim 2, further comprising:

aligning said at least one solder ball with at least one bond pad of a second substrate; and heating to a reflow temperature said at least one solder ball for joining said first substrate and said second substrate.

7. The method of claim 2, further comprising:

heating said ball pickup tool while aligned with said at least one bond pad to temporarily attach said at least one solder ball to said first substrate;

separating said ball pickup tool from said at least one solder ball;

aligning and contacting said at least one bond pad of said first substrate to at least one bond pad of a second substrate; and heating said at least one solder ball to a reflow temperature to join said first substrate to said second substrate.

8. The method of claim 2, wherein the step of aligning said at least one solder ball with said at least one bond pad of said first substrate includes:

lowering said at least one solder ball to contact said at least one bond pad;

moving said at least one solder ball laterally to scrub said at least one bond pad; and centering said at least one solder ball on said at least one bond pad before applying said puff of gas pressure.

9. The method of claim 2, wherein said first substrate comprises one of a circuit board or a semiconductor device.

10. The method of claim 1, wherein said puff of gas pressure results in a pressure at said ball seat of about 0.001–10 psig.

11. The method of claim 1, wherein a duration of said puff of gas pressure is less than 0.5 seconds.

12. The method of claim 1, wherein the step of providing said ball pickup tool comprises providing a pickup tool having a plurality of orifices and a screen for picking up a plurality of solder balls comprising a ball-grid-array.

13. A method for forming a ball-grid-array of preformed solder balls on a substrate for an electronic apparatus, comprising:

providing a ball pickup tool having at least one orifice for picking up a preformed solder ball, said at least one orifice in said ball pickup tool including a ball seat controllably connected to a vacuum source and a pressure source;

providing a solder ball reservoir containing a plurality of preformed miniature solder balls;

lifting said plurality of preformed miniature solder balls in said solder ball reservoir;

lowering said ball pickup tool into said solder ball reservoir;

providing a reservoir containing an attachment agent;

applying vacuum suction from said vacuum source to said at least one orifice to attract and hold at least one solder ball within said at least one orifice;

removing said ball pickup tool and said at least one solder ball from said solder ball reservoir while retaining said vacuum suction;

providing a first substrate for an electronic apparatus having at least one bond pad;

aligning said at least one solder ball with said at least one bond pad of said first substrate for an electronic apparatus;

shutting off said vacuum suction;

applying a puff of gas pressure from said pressure source to said at least one orifice to remove said at least one solder ball from said at least one orifice; and releasing said at least one solder ball onto said at least one bond pad of said first substrate for an electronic apparatus.

14. The method of claim 13, further comprising:

moving said plurality of preformed miniature solder balls upwardly within said solder ball reservoir;

lowering said ball pickup tool and said at least one solder ball into said attachment agent reservoir whereby said attachment agent is applied to an exposed portion of said at least one solder ball; and retracting said ball pickup tool and said at least one solder ball from said attachment agent reservoir.

15. The method of claim 13, further comprising:

heating said first substrate to a reflow temperature; and cooling a portion of said first substrate to fix said at least one solder ball to said at least one bond pad.

16. The method of claim 13, further comprising:

aligning said at least one solder ball with at least one bond pad of a second substrate for an electronic apparatus; and heating to a reflow temperature said at least one solder ball for joining said first substrate for an electronic apparatus and said second substrate for an electronic apparatus.

17. The method of claim 13, further comprising:

heating said ball pickup tool while aligned with said at least one bond pad to temporarily attach said at least one solder ball to said first substrate;

separating said ball pickup tool from said at least one solder ball;

aligning and contacting said at least one bond pad of said first substrate to at least one bond pad of a second substrate; and heating said at least one solder ball to a reflow temperature to join said first substrate to said second substrate.

18. The method of claim 17, wherein the step of aligning said at least one solder ball with said at least one bond pad of said first substrate includes:

lowering said at least one solder ball to contact said at least one bond pad;

moving said at least one solder ball laterally to scrub said at least one bond pad; and centering said at least one solder ball on said at least one bond pad before applying said puff of gas pressure.

19. The method of claim 13, wherein said lifting said plurality of preformed miniature solder balls in said solder ball reservoir comprises injection of a gas stream into said solder ball reservoir to lift said plurality of preformed miniature solder balls.

* * * * *